United States Patent
Shen et al.

(10) Patent No.: US 8,446,000 B2
(45) Date of Patent: May 21, 2013

(54) PACKAGE STRUCTURE AND PACKAGE PROCESS

(76) Inventors: Chi-Chih Shen, Kaohsiung (TW); Jen-Chuan Chen, Taoyuan County (TW); Tommy Pan, Taipei (TW); Hui-Shan Chang, Taoyuan County (TW); Chia-Lin Hung, Taoyuan County (TW)

( * ) Notice: Subject to any disclaimer, the term of this patent is extended or adjusted under 35 U.S.C. 154(b) by 229 days.

(21) Appl. No.: 12/785,704

(22) Filed: May 24, 2010

(65) Prior Publication Data

US 2011/0121442 A1  May 26, 2011

(30) Foreign Application Priority Data

Nov. 24, 2009 (TW) .............................. 98140006 A (51) Int. Cl.
H01L 23/02 (2006.01)
H01L 21/50 (2006.01)

(52) U.S. Cl.
USPC .... 257/686; 257/621; 257/777; 257/E23.126; 257/E23.129; 257/E23.174; 257/E25.006; 257/E25.017; 438/667; 438/672; 438/675

(58) Field of Classification Search
USPC .......... 257/621, 686, 777, E23.126, E23.129, 257/E23.174, E25.006, E25.017; 438/667, 438/672, 675
See application file for complete search history.

(56) References Cited

U.S. PATENT DOCUMENTS

| | | | |
|---|---|---|---|
| 3,761,782 A | 9/1973 | Youmans | |
| 4,394,712 A | 7/1983 | Anthony | |
| 4,499,655 A | 2/1985 | Anthony | |
| 4,807,021 A | 2/1989 | Okumura | |
| 4,842,699 A | 6/1989 | Hua et al. | |
| 4,897,708 A | 1/1990 | Clements | |
| 4,982,265 A | 1/1991 | Watanabe et al. | |
| 5,166,097 A | 11/1992 | Tanielian | |
| 5,191,405 A | 3/1993 | Tomita et al. | |
| 5,229,647 A | 7/1993 | Gnadinger | |
| 5,239,448 A | 8/1993 | Perkins et al. | |
| 5,308,443 A | 5/1994 | Sugihara | |
| 5,404,044 A | 4/1995 | Booth et al. | |
| 5,615,477 A | 4/1997 | Sweitzer | |
| 5,643,831 A | 7/1997 | Ochiai et al. | |
| 5,998,292 A | 12/1999 | Black et al. | |
| 6,276,599 B1 | 8/2001 | Ogawa | |

(Continued)

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

Primary Examiner — Peniel M Gumedzoe
(74) Attorney, Agent, or Firm — Morgan Law Offices, PLC (57) ABSTRACT

A package process includes following steps. A circuit mother board comprising a plurality of circuit boards is disposed on a carrier. Semiconductor devices are provided, wherein each of the semiconductor devices has a top surface and a bottom surface opposite thereto. Each of the semiconductor devices has conductive vias each having a first end surface and a second end surface exposed by the bottom surface of the semiconductor device. The semiconductor devices are connected to the corresponding circuit boards through their conductive vias with their bottom surface facing the circuit mother board. An insulating paste is formed between each of the semiconductor devices and its corresponding circuit board. A protection layer is formed on the circuit mother board to cover the semiconductor devices. Then, the protection layer and the semiconductor devices are thinned to expose the first end surface of each of the conductive vias.

23 Claims, 11 Drawing Sheets

U.S. PATENT DOCUMENTS

| | | |
|---|---|---|
| 6,329,631 B1 | 12/2001 | Yueh |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,670,269 B2 | 12/2003 | Mashino |
| 6,699,787 B2 | 3/2004 | Mashino |
| 6,740,950 B2 | 5/2004 | Paek |
| 6,812,549 B2 | 11/2004 | Umetsu et al. |
| 6,815,348 B2 | 11/2004 | Mashino |
| 6,962,829 B2 | 11/2005 | Glenn et al. |
| 7,078,269 B2 | 7/2006 | Yamasaki et al. |
| 7,134,198 B2 | 11/2006 | Nakatani |
| 7,157,372 B1 | 1/2007 | Trezza |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,482,272 B2 | 1/2009 | Trezza |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,598,163 B2 | 10/2009 | Callahan et al. |
| 7,605,463 B2 | 10/2009 | Sunohara |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,842,597 B2 | 11/2010 | Tsai |
| 7,843,072 B1 * | 11/2010 | Park et al. ............ 257/774 |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0189635 A1 | 9/2005 | Humpston et al. |
| 2005/0258545 A1 | 11/2005 | Kwon |
| 2006/0027632 A1 | 2/2006 | Akram |
| 2006/0197216 A1 | 9/2006 | Yee |
| 2007/0048896 A1 | 3/2007 | Andry et al. |
| 2007/0126085 A1 * | 6/2007 | Kawano et al. ............ 257/621 |
| 2007/0138562 A1 | 6/2007 | Trezza |
| 2007/0187711 A1 | 8/2007 | Hsiao et al. |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0327465 A1 | 12/2010 | Shen et al. |
| 2011/0024888 A1 | 2/2011 | Pagaila et al. |
| 2011/0048788 A1 | 3/2011 | Wang et al. |
| 2011/0068437 A1 | 3/2011 | Chiu et al. |

\* cited by examiner

PACKAGE STRUCTURE AND PACKAGE PROCESS

CROSS-REFERENCE TO RELATED APPLICATION

This application claims the priority benefit of Taiwan application serial no. 98140006, filed on Nov. 24, 2009. The entirety of the above-mentioned patent application is hereby incorporated by reference herein and made a part of this specification.

BACKGROUND OF THE INVENTION

1. Field of the Invention

The present invention relates to a package structure and a package process thereof. More particularly, the present invention relates to the package structure and the package process suitable for stacked package of semiconductor device.

2. Description of Related Art

In today's information society, users all seek after electronic products with high speed, high quality and multiple functions. In terms of the product exterior appearance, electronic product designs reveal a trend of light weight, thinness and compactness. Stacked package of semiconductor devices are accordingly developed to meet the above requirements.

In the stacked semiconductor device package, several semiconductor devices are perpendicularly stacked together in the same package structure so that the package density is improved and the dimension of the package structure is decreased. Furthermore, by using three-dimensional stacking method to decrease the path length of the signal transmission between the semiconductor devices, rate of the signal transmission is improved and the semiconductor devices with different functions can be combined in the same package structure.

The conventional stacked semiconductor device package firstly stacks plural semiconductor devices together to form a stacked structure of semiconductor devices, wherein at least one of the semiconductor devices has a plurality of through silicon vias (TSVs) to electrically connect the semiconductor devices together through the TSVs. Then the stacked structure of semiconductor devices is bonded to a circuit board through the TSVs, and a molding compound is formed on the circuit board to preserve the stacked structure of semiconductor devices. In other words, the prior art forms the stacked structure of semiconductor devices first and then bonded the stacked structure on the circuit board.

However, in the conventional manufacturing method of stacked semiconductor device package, the kind or circuit layout of the semiconductor devices needs to be predetermined at the start of the package process, and thus the selectivity or the collocation of semiconductor device is restricted.

SUMMARY OF THE INVENTION

The present invention is directed to a package structure suitable for being applied in stacked package of various semiconductor devices according to practical requirements.

The present invention is directed to a package process which increases the selectivity of semiconductor device of the package structure in the stacked package of semiconductor device.

As embodied and broadly described herein, a package process is provided. Firstly, a carrier is provided. Then, a circuit mother board comprising a plurality of circuit boards is disposed on the carrier. Plural first semiconductor devices are provided, wherein each of the first semiconductor devices has a first top surface and a bottom surface opposite to the first top surface, each of the first semiconductor devices has a plurality of conductive vias, and each of the conductive vias has a first end surface and a second end surface which is opposite to the first end surface and exposed by the bottom surface of the corresponding first semiconductor device. Then, the first semiconductor devices are bonded to their corresponding circuit boards through their conductive vias, wherein the bottom surface of each of the first semiconductor devices faces the circuit mother board. Afterwards, a first protection layer is formed on the circuit mother board to cover the first semiconductor devices. Then, the first protection layer and the first semiconductor devices are thinned to expose the first end surface of each of the conductive vias.

In one embodiment of the present invention, the aforementioned package process further comprises removing the first protection layer after exposing the first end surface of each of the conductive vias, and forming a second protection layer on the circuit mother board to cover the first semiconductor devices.

According to an embodiment of the present invention, the above package process further includes the following steps. The second protection layer is thinned to expose the first end surface of each of the conductive vias, wherein the second protection layer covers a second top surface of each of the first semiconductor devices far away from the circuit mother board, and an end portion of each of the conductive vias far away from the circuit mother board protrudes outside the second protection layer. Then, a plurality of second semiconductor devices are bonded to the first semiconductor devices respectively, wherein the conductive vias of each of the first semiconductor devices are connected to the corresponding second semiconductor device. Afterwards, a third protection layer is formed on the circuit mother board to cover the second semiconductor devices. Then, the circuit mother board is detached from the carrier. Next, the second protection layer, the third protection layer and the circuit mother board are sawed along an outline of each of the circuit boards to form a plurality of package structures.

According to an embodiment of the present invention, a second insulating paste is formed between each of the first semiconductor devices and its corresponding second semiconductor device after exposing the conductive vias and before forming the third protection layer.

According to an embodiment of the present invention, a plurality of solder balls are formed on a surface of each of the circuit boards far away from its corresponding first semiconductor device after detaching the circuit mother board from the carrier.

According to an embodiment of the present invention, a grinding process is performed to a first side of the first protection layer far away from the circuit mother board to expose the first end surface of each of the conductive vias, and then the first protection layer and the first semiconductor devices are thinned from the first side of the first protection layer, so as to protrude an end portion of each of the conductive vias from a second top surface of the corresponding first semiconductor device far away from the circuit mother board.

According to an embodiment of the present invention, a surface treatment is applied to the first end surface of each of the conductive vias to form a covering layer thereon.

According to an embodiment of the present invention, a first insulating paste is formed on each of the circuit boards before bonding each of the first semiconductor devices to its corresponding circuit board, and then each of the first semiconductor devices is bonded to its corresponding circuit board by disposing each of the first semiconductor devices onto the corresponding first insulating paste, wherein each of the first insulating pastes encapsulates a plurality of conductive bumps on the bottom surface of the corresponding first semiconductor device, and the conductive bumps connect with the corresponding circuit board.

According to an embodiment of the present invention, a first insulating paste is filled between each of the semiconductor devices and its corresponding circuit board after bonding the first semiconductor device to the corresponding circuit board.

According to an embodiment of the present invention, a plurality of second semiconductor devices are bonded to the first semiconductor devices respectively after exposing the first end surface of each of the conductive vias, wherein the conductive vias of each of the first semiconductor devices are connected to the corresponding second semiconductor device. Then, a third protection layer is formed on the circuit mother board to cover the second semiconductor devices. Next, the circuit mother board is detached from the carrier, and the first protection layer, the third protection layer and the circuit mother board are sawed along an outline of each of the circuit boards to form a plurality of package structures.

According to the above embodiment of the present invention, a second insulating paste may be formed between each of the first semiconductor devices and its corresponding second semiconductor device after exposing the conductive vias and before forming the third protection layer.

According to the above embodiment of the present invention, a plurality of solder balls may be formed on a surface of each of the circuit boards far away from its corresponding first semiconductor device after detaching the circuit mother board from the carrier.

The present invention further provides a package structure comprising a circuit board, a first semiconductor device and a first protection layer. The first semiconductor device is disposed on the circuit board, wherein the first semiconductor device has a top surface and a bottom surface which is opposite to the top surface and facing the circuit board, the first semiconductor devices has a plurality of conductive vias, and each of the conductive vias has a first end surface exposed by the top surface and a second end surface exposed by the bottom surface. The first protection layer is disposed on the circuit board, wherein the protection layer covers at least a side wall of the first semiconductor device and exposes the first end surface of each of the conductive vias, and the side wall of the first protection layer is substantially aligned with a side wall of the circuit board.

According to an embodiment of the present invention, the packaging structure further comprises a covering layer disposed on the first end surface of each of the conductive vias.

According to an embodiment of the present invention, the package structure further comprises a first insulating paste disposed between the first semiconductor device and the circuit board and encapsulating a plurality of conductive bumps on the bottom surface of the first semiconductor device, wherein the conductive bumps are connected to the circuit board.

According to an embodiment of the present invention, the package structure further comprises a plurality of solder balls disposed on a surface of the circuit board far away from the first semiconductor device.

According to an embodiment of the present invention, the package structure further comprises a second semiconductor device and a third protection layer, wherein the second semiconductor device is disposed on the top surface of the first semiconductor device and connected to the conductive vias of the first semiconductor device, and the third protection layer is disposed on the circuit board and covers the second semiconductor device.

According to an embodiment of the present invention, the package structure further comprises a second insulating paste disposed between the first semiconductor device and the second semiconductor device.

According to an embodiment of the present invention, a side wall of the third protection layer is substantially aligned with the side wall of the first protection layer and the side wall of the circuit board.

According to an embodiment of the present invention, an end portion of each of the conductive vias far away from the circuit board protrudes from the top surface of the first semiconductor device.

According to an embodiment of the present invention, a top surface of the first protection layer far away from the circuit board is substantially aligned with the top surface of the first semiconductor device.

According to an embodiment of the present invention, a part of the first protection layer covers the top surface of the first semiconductor device, and an end portion of each of the conductive vias far away from the circuit board protrudes from a surface of the first protection layer far away from the circuit board.

According to an embodiment of the present invention, a top surface of the first protection layer far away from the circuit board is above or below the top surface of the first semiconductor device.

Based on the above, a package structure is provided by disposing the first semiconductor device on the circuit mother board to expose conductive vias of the first semiconductor device. A preferred second semiconductor device is then optionally and selectively bonded to the first semiconductor device according to practical requirements. Therefore, the selectivity or the collocation between the first semiconductor device and the second semiconductor device is flexible.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

FIGS. 1A through 1G are cross-sectional views illustrating a process of fabricating a package structure according to an embodiment of the present invention.

Figure 1A:
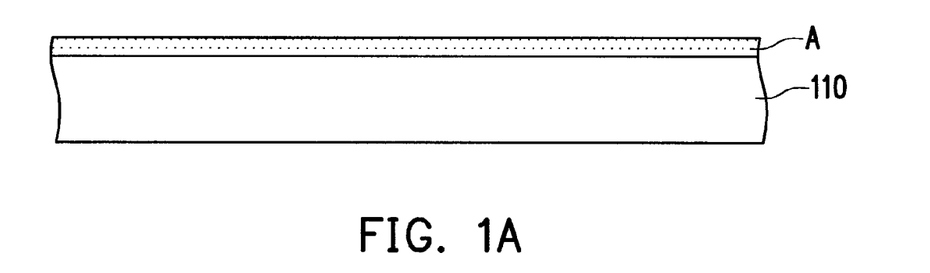
FIGS. 1A through 1G are cross-sectional views illustrating a process of fabricating a package structure according to an embodiment of the present invention.
Figure 1B:
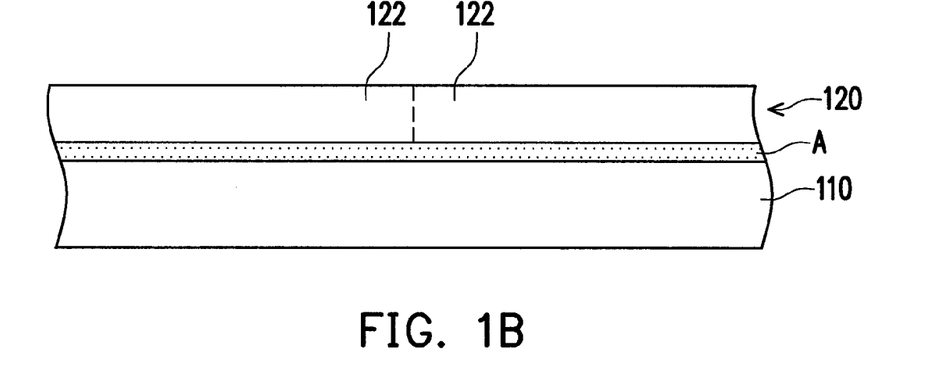

Firstly, referring to FIG. 1A, a carrier 110 is provided. An adhesive layer A is formed on the carrier 110 in this embodiment. Then, referring to FIG. 1B, a circuit mother board 120 comprising a plurality of circuit boards 122 is disposed on the adhesive layer A.

Figure 1C:
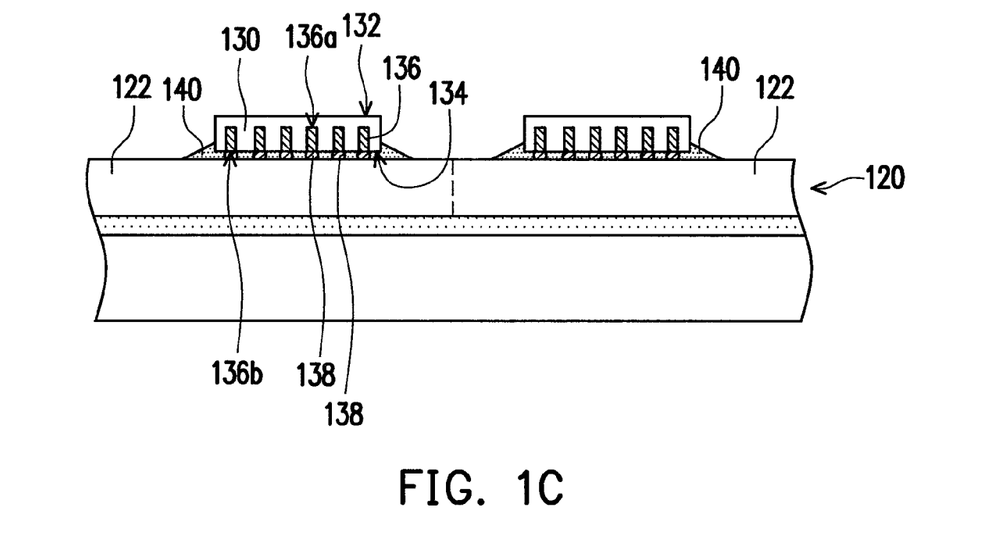

Referring to FIG. 1C, a plurality of first semiconductor devices (e.g. chips) 130 are provided, wherein each of the first semiconductor devices 130 has a top surface 132 and a bottom surface 134 opposite thereto. In addition, each of the first semiconductor devices 130 has a plurality of conductive vias 136, wherein each of the conductive vias 136 has a first end surface 136a and a second end surface 136b which is opposite to the first end surface 136a and exposed by the bottom surface 134 of the first semiconductor device 130 correspondingly. It is noted that the word "correspondingly" in the above refers to the relationship between the bottom surface 134 and the conductive vias 136 of the same first semiconductor device 130. In this embodiment, the conductive vias can be through silicon vias (TSVs). Then, the first semiconductor devices 130 are bonded to their corresponding circuit boards 122 through their conductive vias 136 and conductive bumps 138 formed on their bottom surfaces 134, wherein the bottom surface 134 of each of the first semiconductor devices 130 faces the circuit mother board 120, while the top surface 132 of each of the first semiconductor devices 130 is far away from the circuit mother board 120.

In this embodiment, a first insulating paste 140 is formed between each of the first semiconductor devices 130 and the corresponding circuit board 122 to protect the conductive bumps 138, wherein the first insulating paste 140 can be formed before or after bonding the first semiconductor devices 130 to their corresponding circuit boards 122. A material of the first insulating pastes 140 is, for example, non-conductive polymer (NCP) or other applicable underfill material.

Specifically, the first insulating pastes 140 can be formed before bonding the first semiconductor devices 130 to their corresponding circuit boards 122 by disposing each of the first semiconductor devices 130 onto the corresponding first insulating paste 140, wherein each of the first insulating pastes 140 encapsulates the conductive bumps 138 on the bottom surface 134 of the corresponding first semiconductor device 130, and the conductive bumps 138 connect with the corresponding circuit board 122. Alternatively, the first insulating pastes 140 can be formed after bonding the first semiconductor devices 130 to their corresponding circuit boards 122 by filling an insulating material therebetween.

Figure 1D:
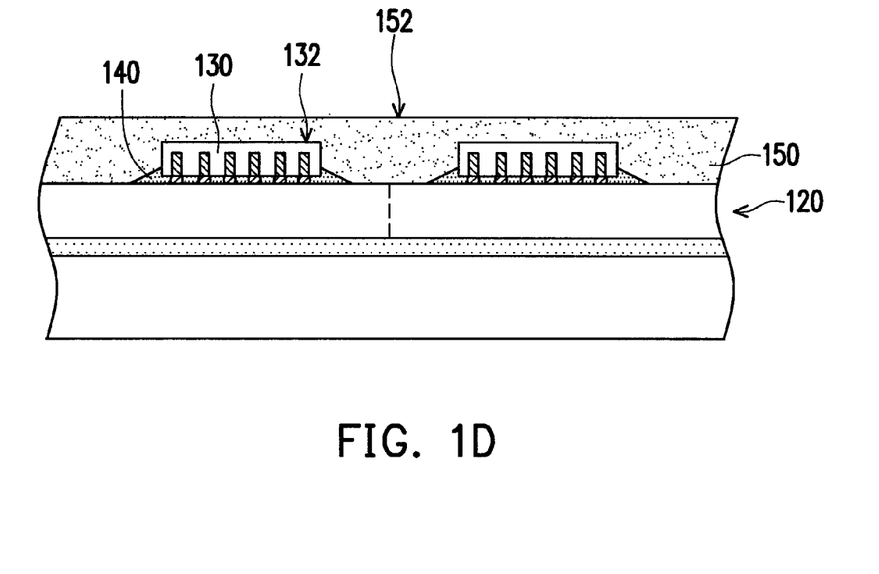

Afterwards, referring to FIG. 1D, a first protection layer 150 is formed on the circuit mother board 120 to cover the first semiconductor devices 130. In the present embodiment, the protection layer 150 is, for example, formed by coating or molding.

Figure 1E:
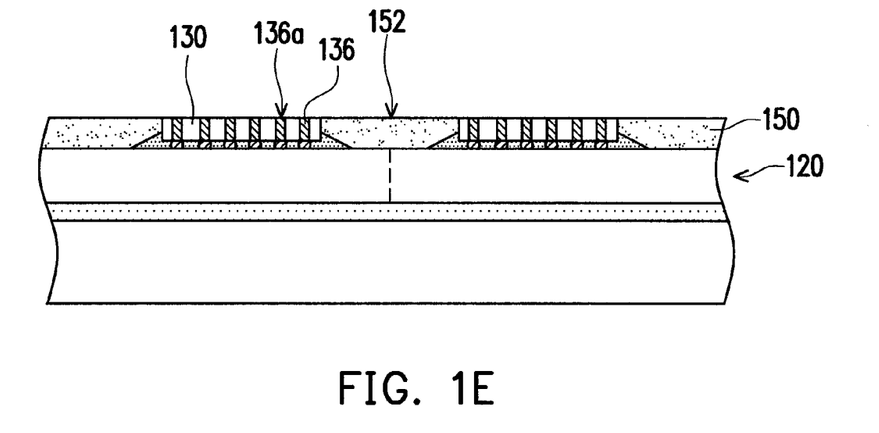
Figure 1F:
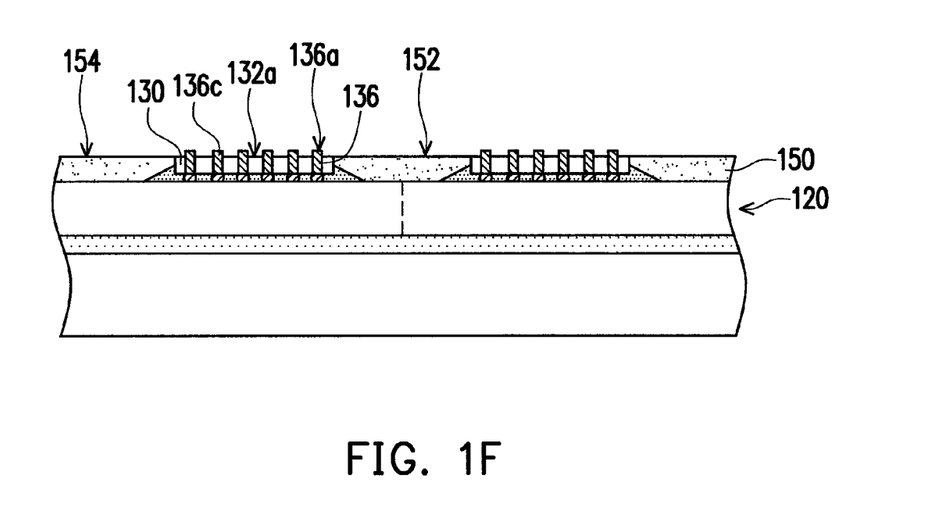

Then, referring to FIG. 1F, the first protection layer 150 and the first semiconductor devices 130 are thinned to expose the first end surface 136a of each of the conductive vias 136. In detail, according to the present embodiment, the process of thinning the first protection layer 150 and the first semiconductor devices 130 is illustrated in the following. Referring to FIGS. 1D and 1E, a grinding process is performed to a first side 152 of the first protection layer 150 far away from the circuit mother board 120 to expose the first end surface 136a of each of the conductive vias 136. The grinding process can be a regular grinding process or a chemical mechanical polishing (CMP) process.

Then, referring to FIG. 1F, the first protection layer 150 and the first semiconductor devices 130 are thinned from the first side 152 of the first protection layer 150, so as to protrude an end portion 136c of each of the conductive vias 136 from the top surface 132a of the corresponding first semiconductor device 130 far away from the circuit mother board 120. Except the aforementioned CMP process, the first protection layer 150 and the first semiconductor devices 130 can further be thinned by chemical etching, ashing, grinding or other applicable process capable of thinning the first protection layer 150 and the first semiconductor devices 130 simultaneously or individually. In the present embodiment, an etchant of the CMP process has a higher etching rate with respect to silicon than to the conductive vias 136 is preferred, so as to prevent excessive etching of the conductive vias 136 in the thinning process.

It is noted that, in the present embodiment, the first protection layer 150 and the first semiconductor devices 130 can be thinned simultaneously or individually, and accordingly the top surface 154 of the first protection layer 150 far away from the circuit mother board 120 and the top surface 132a of each of the first semiconductor devices 130 can be coplanar with each other or not.

Figure 1G:
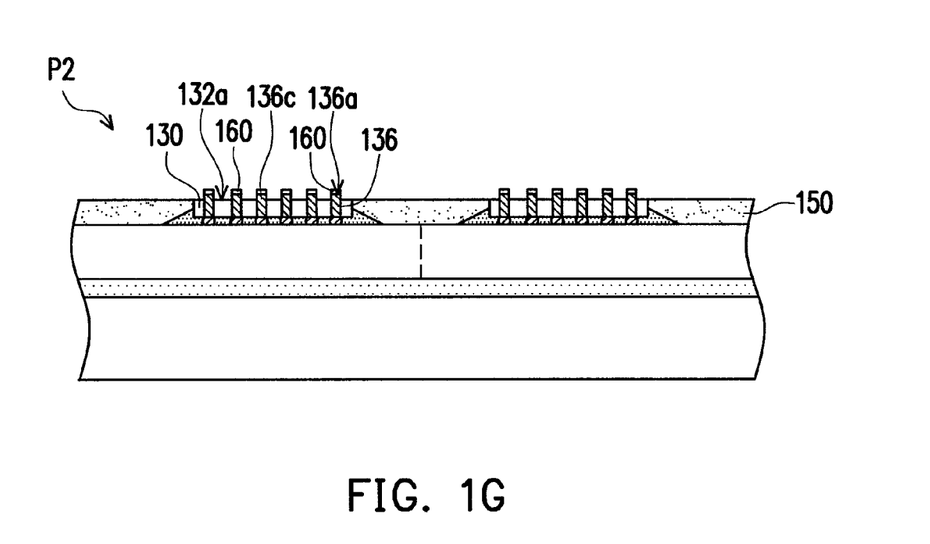

Thereafter, referring to FIG. 1G, a surface treatment can be applied to the first end surface 136a of each of the conductive vias 136 so as to form a covering layer 160 thereon. A material of covering layer can be selected from a group consisting of nickel-gold, nickel-palladium-gold, silver, tin, solder paste, organic solderability preservative (OSP) and combinations thereof. In other embodiments, the covering layer 160 can further cover the end portion 136c of each of the conductive vias 136 protruding from the top surface 132a.

Figure 2A:
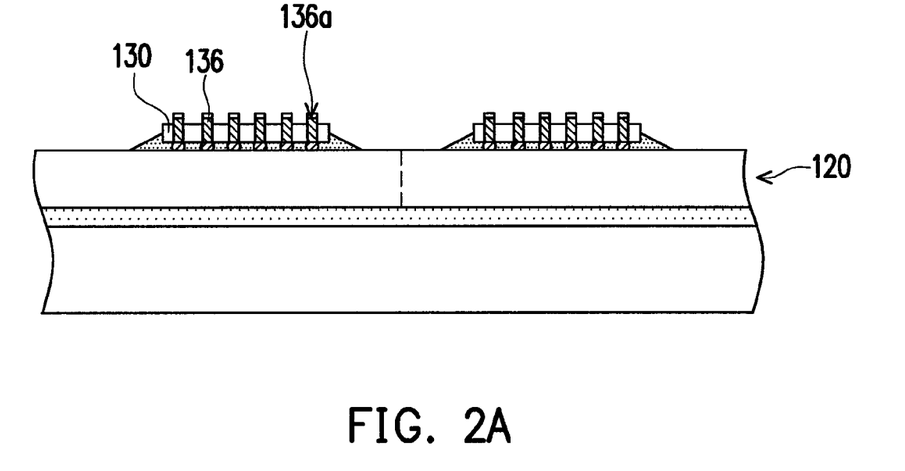
FIGS. 2A and 2B are cross-sectional views illustrating a sequent process of fabricating the package structure in FIG. 1G.
Figure 2B:
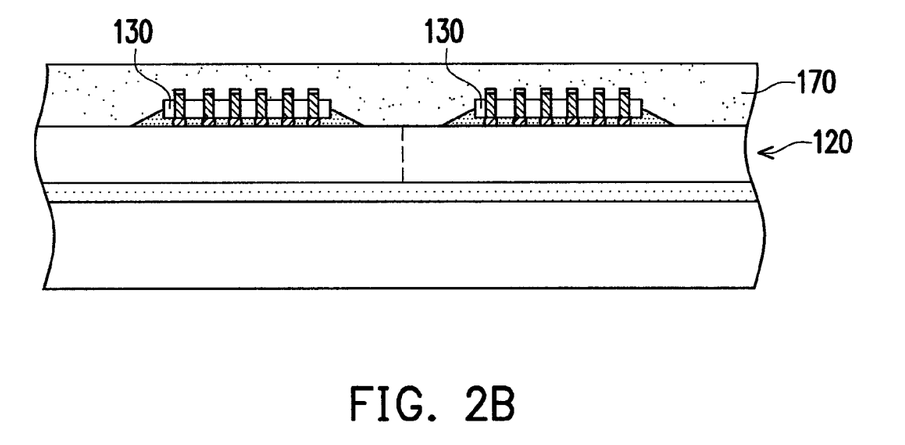

FIGS. 2A and 2B are cross-sectional views illustrating a sequent process of fabricating the package structure in FIG. 1G. Referring to FIG. 2A, the material of the first protection layer 150 can be a removable material such that the first protection layer 150 can be removed after the end portions 136c of the conductive vias 136 are exposed. Then, referring to FIG. 2B, a second protection layer 170 is formed on the circuit mother board 120 to cover the first semiconductor devices 130 for being as a molding compound, wherein the second protection layer 170 may be formed by coating or molding.

Figure 3A:
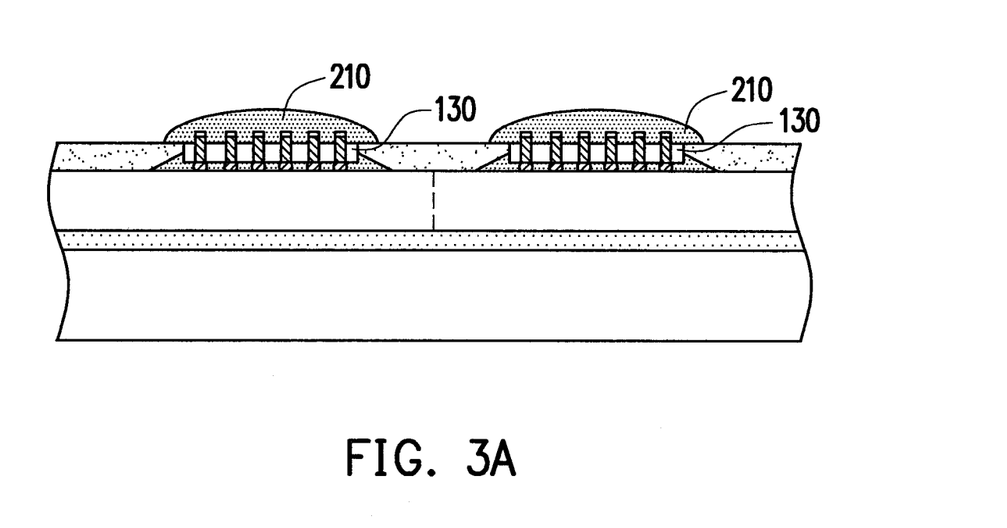
FIGS. 3A through 3F are cross-sectional views illustrating a sequent process of fabricating the package structure in FIG. 1G according to another embodiment of the present embodiment.
Figure 3B:
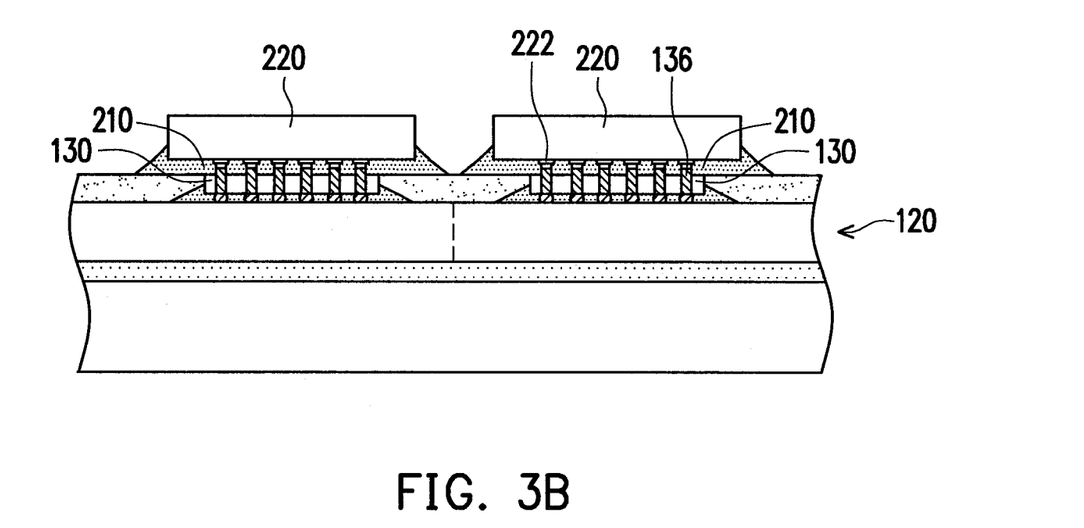

FIGS. 3A through 3F are cross-sectional views illustrating a sequent process of fabricating the package structure in FIG. 1G according to another embodiment of the present embodiment. Following the process illustrated in FIG. 1G, as shown in FIG. 3A, a second insulating paste 210 can be formed on each of the first semiconductor devices 130, wherein a material of the second insulating paste 210 is, for example, non-conductive polymer (NCP) or other applicable underfill material. Then, as shown in FIG. 3B, a plurality of second semiconductor devices (e.g. chips) 220 are respectively disposed on their corresponding second insulating paste 210, wherein each of the second semiconductor devices 220 is connected to its corresponding first semiconductor device 130 by bonding conductive vias 136 of the first semiconductor device 130 with pads 222 of the second semiconductor device 220 respectively.

In other embodiments, the second insulating paste 210 can be formed after bonding the second semiconductor devices 220 to their corresponding first semiconductor devices 130 by filling the second insulating paste 210 therebetween.

Figure 3C:
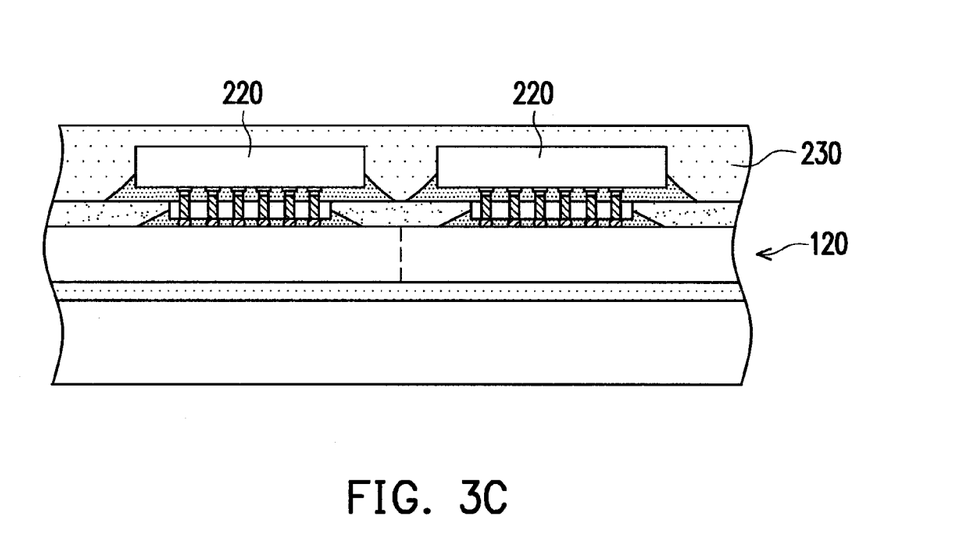
Figure 3D:
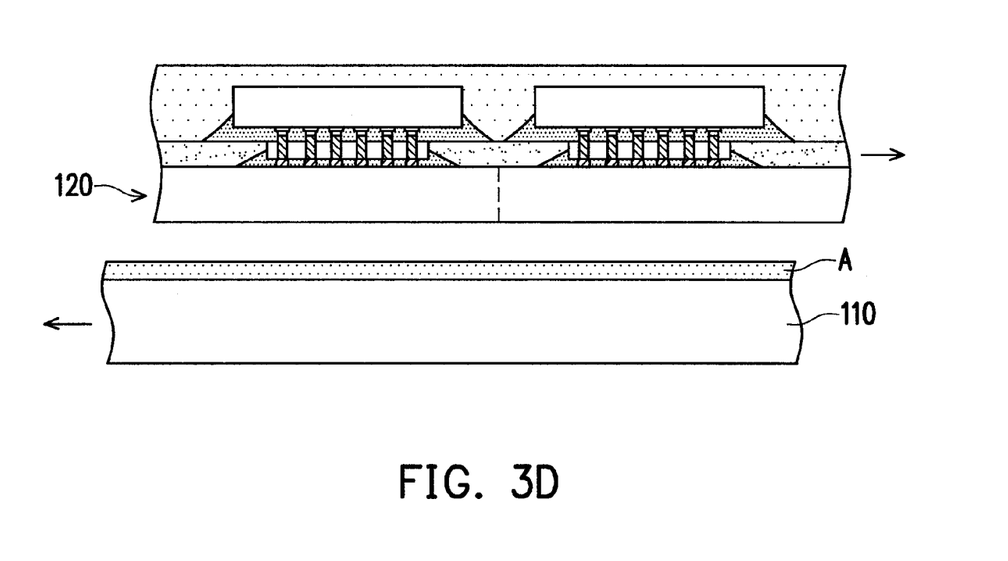

Then, referring to FIG. 3C, a third protection layer 230 is formed on the circuit mother board 120 to cover the second semiconductor devices 220, wherein the third protection layer 230 may be formed by coating or molding. Next, referring to FIG. 3D, the circuit mother board 120 is detached from the adhesive layer A and the carrier 110. Then, referring to FIG. 3E, a plurality of solder balls 240 are formed on a surface 122a of each of the circuit board 122 far away from its corresponding first semiconductor device 130.

Figure 3E:
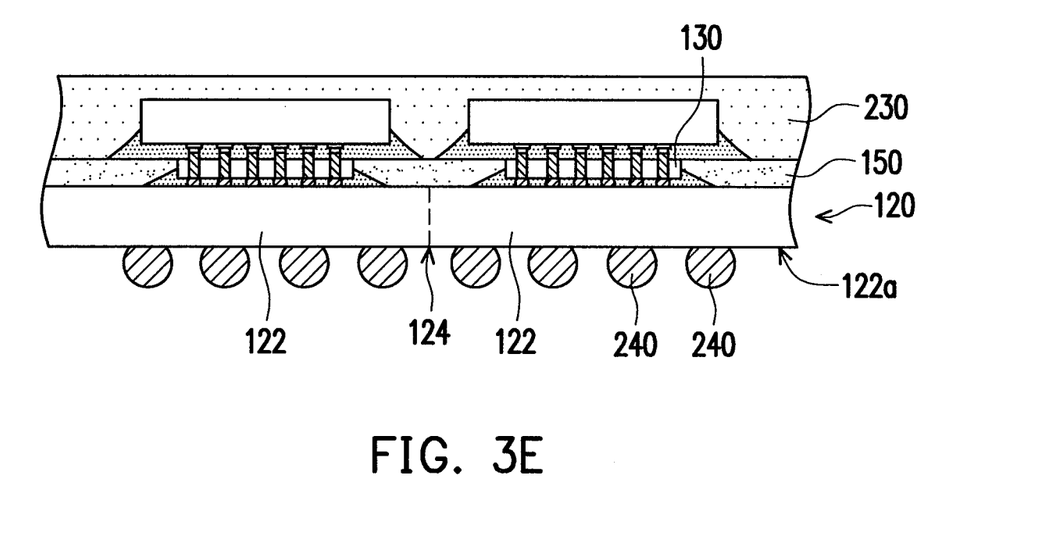
Figure 3F:
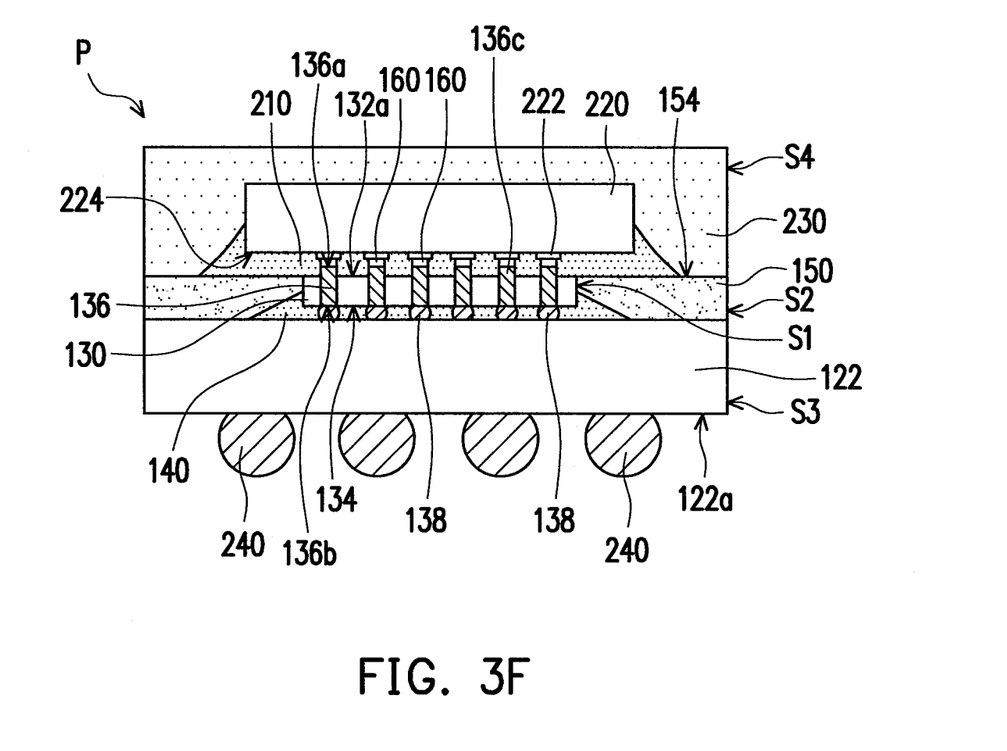

Then, referring to FIGS. 3E and 3F, the first protection layer 150, the third protection layer 230 and the circuit mother board 120 are sawed along an outline of each of the circuit boards 122 to form a plurality of package structures P (FIG. 3F exemplarily shows only one package structure P).

It is noted that although the package structure P of this embodiment is presented as stacking one second semiconductor device 220 on one first semiconductor device, however, the quantity of semiconductor devices stacked in the package structure P is not limited in the present invention. In further another embodiment, the package structure P may have three or more semiconductor devices stacked with one another, while these semiconductor devices are electrically connected through their conductive vias 136.

Figure 4:
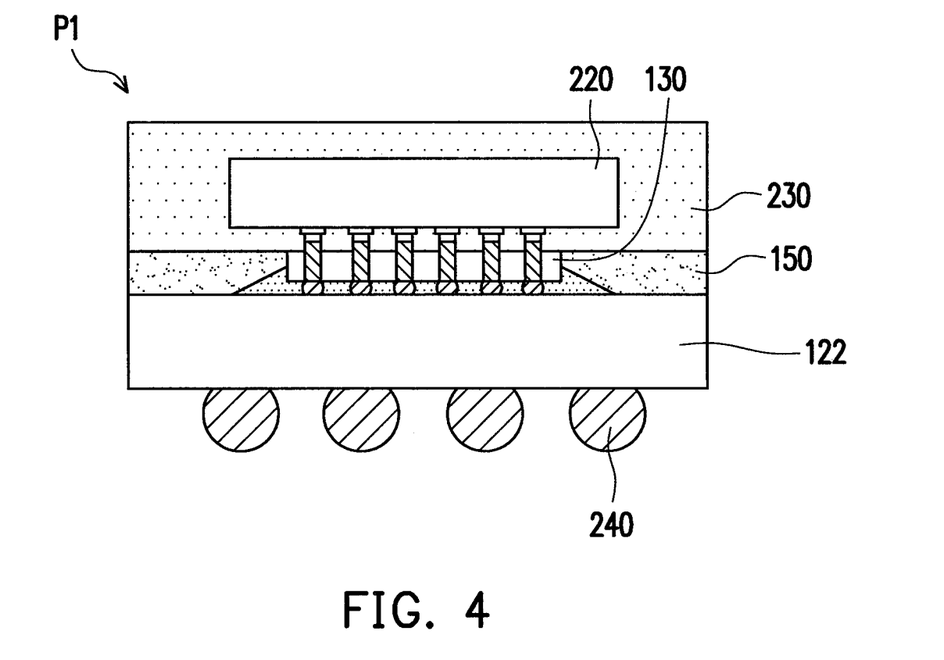
FIG. 4 shows another package structure different from that in FIG. 3F.

FIG. 4 shows another package structure different from that in FIG. 3F. Referring to FIG. 4, without forming the second insulating paste 210 as shown in FIGS. 3A and 3B, the third protection layer 230 formed in FIG. 3C can be filled between each of the first semiconductor devices 130 and the corresponding second semiconductor device 220, and then the process in FIGS. 3D through 3F (i.e. detaching the circuit mother board 120 and the carrier 110, forming the solder balls 240, and sawing the first protection layer 150, the third protection layer 230 and the circuit mother board 120) is performed to form the structure package P in FIG. 4.

Comparing with the prior art which stacks semiconductor devices before bonding the stacked structure to a circuit board, the illustrated embodiment bonds the first semiconductor devices 130 onto the circuit mother board 120 first to provide a package structure P2 (as shown in FIG. 1G) with plural exposed conductive vias 136, and then various types of second semiconductor devices 220 can be optionally and selectively bonded to the first semiconductor devices 130 according to practical requirements. Therefore, the collocation between the first semiconductor device 130 and the second semiconductor device 220 is flexible.

In other words, one may manufactures the package structure P2 and provides the same to the other one, while the other one can select a second semiconductor device 220 according to practical requirements and bond the same to the first semiconductor device 130 of the package structure P2 to obtain a preferred package structure P as shown in FIG. 3F. Since the fabrication of the package structure P is properly divided into the above two independent processes, the selectivity of the stacked semiconductor devices can be increased.

Details of the package structure P in FIG. 3F is illustrated in the following.

Referring to FIG. 3F, the package structure P comprises a circuit board 122, a first semiconductor device 130 and a first protection layer 150. The first semiconductor device 130 is disposed on the circuit board 122 and has a top surface 132a and a bottom surface 134 which is opposite to the top surface 132a and facing the circuit board 122. In addition, the first semiconductor device 130 has a plurality of conductive vias 136, wherein each of the conductive vias 136 has a first end surface 136a and a second end surface 136b which is opposite to the first end surface 136a and exposed by the bottom surface 134 of the first semiconductor device 130. The conductive vias 136 penetrate the first semiconductor device 130, wherein an end portion 136c of each of the conductive vias 136 far away from the circuit board 122 protrudes from the top surface 132a of the first semiconductor device 130.

Particularly, the first semiconductor device 130 is connected to the circuit board 122 via plural conductive bumps 138 on the bottom surface 134, and a first insulating paste 140 is formed between the first semiconductor devices 130 and the circuit board 122 to protect the conductive bumps 138.

A covering layer 160 is formed on the first end surface 136a of each of the first conductive vias 136, so as to prevent the conductive vias 136 from oxidation or pollution in the surroundings and improve the bondability between the conductive vias 136 and other electronic devices such as another semiconductor device.

The first protection layer 150 is disposed on the circuit board 122, wherein the first protection layer 150 covers the sidewall S1 of the first semiconductor device 130 and exposes the first end surface 136a of each of the conductive vias 136. The sidewall S2 of the first protection layer 150 is aligned with the sidewall S3 of the circuit board 122, while the top surface 154 of the first protection layer 150 far away from the circuit board 122 is aligned with the top surface 132a of the first semiconductor device 130. In other embodiments, the first insulating paste 140 can be replaced by a portion of the first protection layer 150 filled between the first semiconductor device 130 and the circuit board 122.

According to this embodiment, a second semiconductor device 220 is disposed on the top surface 132a of the first semiconductor device 130, wherein pads 222 on the bottom surface 224 of the second semiconductor device 220 are respectively connected to the conductive vias 136 of the first semiconductor device 130. Furthermore, a second insulating paste 210 is disposed between the first semiconductor device 130 and the second semiconductor device 220 to preserve the bonding region between the first semiconductor device 130 and the second semiconductor device 220, including the pads 222, the covering layers 160 and the first end surface 136a of each of the conductive vias 136. According to this embodiment, a second semiconductor device 220 is disposed on the top surface 132a of the first semiconductor device 130, wherein pads 210 on the bottom surface 224 of the second semiconductor device 220 are respectively connected to the conductive vias 136 of the first semiconductor device 130.

In addition, a third protection layer 230 is disposed on the circuit board 122 to preserve the second semiconductor device 220 from pollution of the surroundings or damage caused by sequent process. The third protection layer 230 covers the second semiconductor device 220, wherein the sidewall S4 of the third protection layer 230 is aligned with the sidewall S2 of the first protection layer 150 and the sidewall S3 of the circuit board 122. In other embodiments, the second insulating paste 210 can be replaced by a portion of the third protection layer 230 filled between the first semiconductor device 130 and the second semiconductor device 220.

Furthermore, plural solder balls 240 are disposed on the surface 122a of the circuit board 122 far away from the first semiconductor device 130, by which the first semiconductor device 130 and the second semiconductor device 220 are electrically connected to other electronic devices.

Figure 5A:
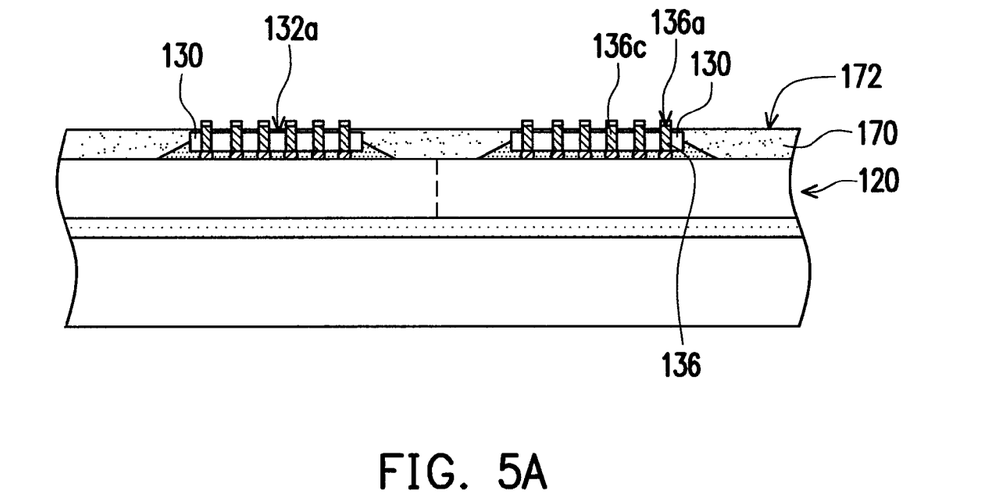
FIGS. 5A through 5F are cross-sectional views illustrating a sequent process of fabricating the package structure in FIG. 2B according to another embodiment of the present embodiment.

FIGS. 5A through 5F are cross-sectional views illustrating a sequent process of fabricating the package structure in FIG. 2B according to another embodiment of the present embodiment. Referring to FIG. 5A, the second protection layer 170 is thinned to expose the first end surface 136a of each of the conductive vias 136. In this embodiment, the second protection layer 170 covers the top surface 132a of each of the first semiconductor devices 130, and an end portion 136c of each of the conductive vias 136 far away from the circuit mother board 120 protrudes from a surface 172 of the second protection layer 170 far away from the circuit mother board 120.

Figure 5B:
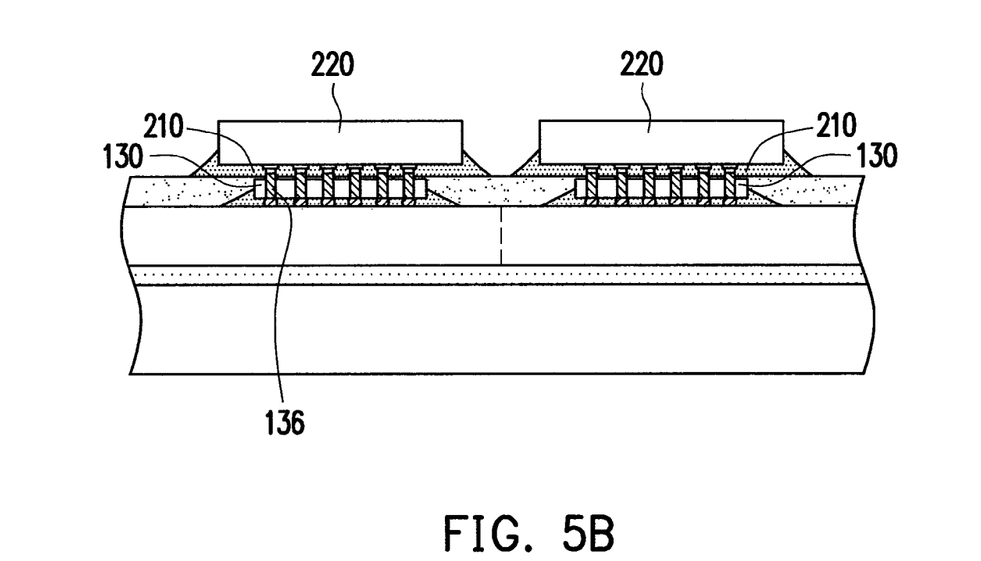

Then, referring to FIG. 5B, plural second semiconductor devices 220 are respectively bonded to the first semiconductor devices 130, wherein the conductive vias 136 of each of the first semiconductor devices 130 are connected to the corresponding second semiconductor device 220. In this embodiment, a second insulating paste 210 can be optionally and selectively formed between each of the first semiconductor devices 130 and the corresponding second semiconductor device 220, wherein the second insulating paste 210 can be formed before or after bonding the second semiconductor devices 220 to their corresponding first semiconductor devices 130.

Figure 5C:
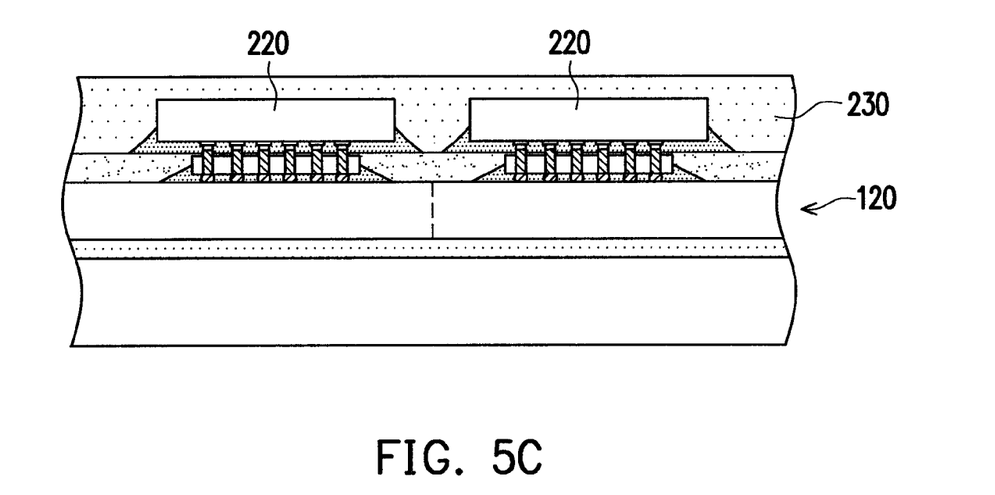

Afterwards, referring to FIG. 5C, a third protection layer 230 is formed on the circuit mother board 120 to cover the second semiconductor devices 220.

Figure 5D:
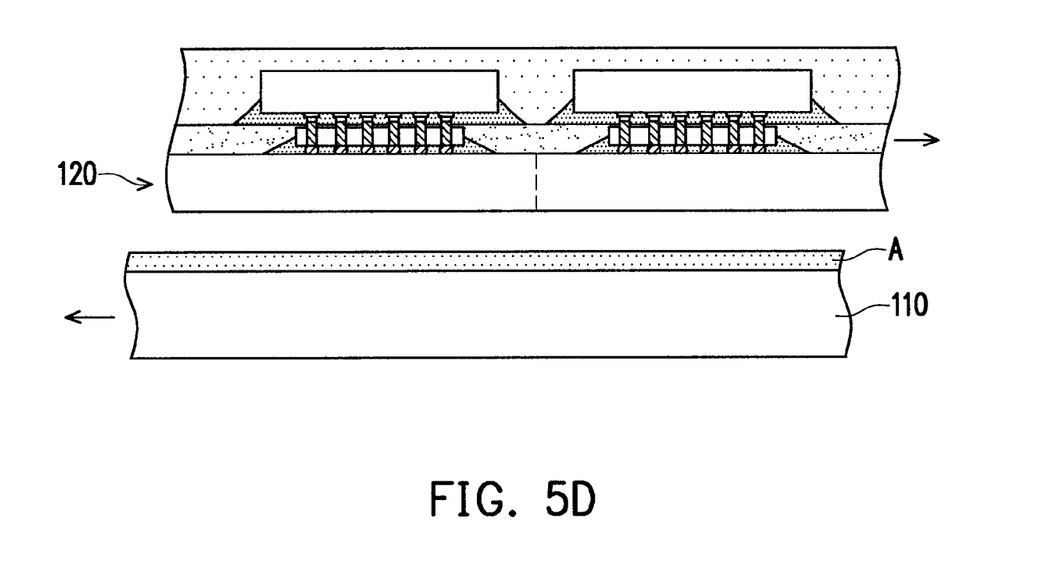

Next, referring to FIG. 5D, the circuit mother board 120 is detached from the adhesive layer A and the carrier 110.

Figure 5E:
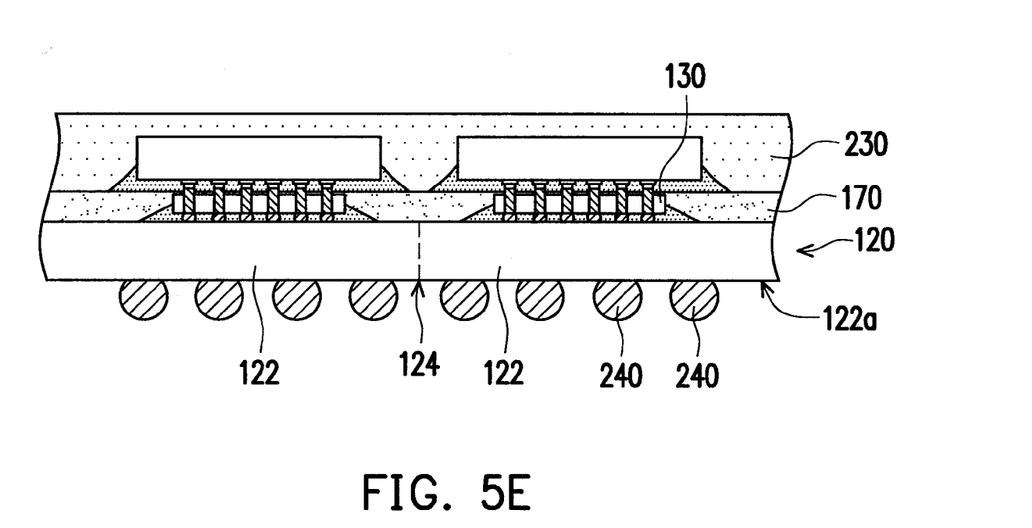

Then, referring to FIG. 5E, a plurality of solder balls 240 are formed on a surface 122a of each of the circuit board 122 far away from its corresponding first semiconductor device 130.

Figure 5F:
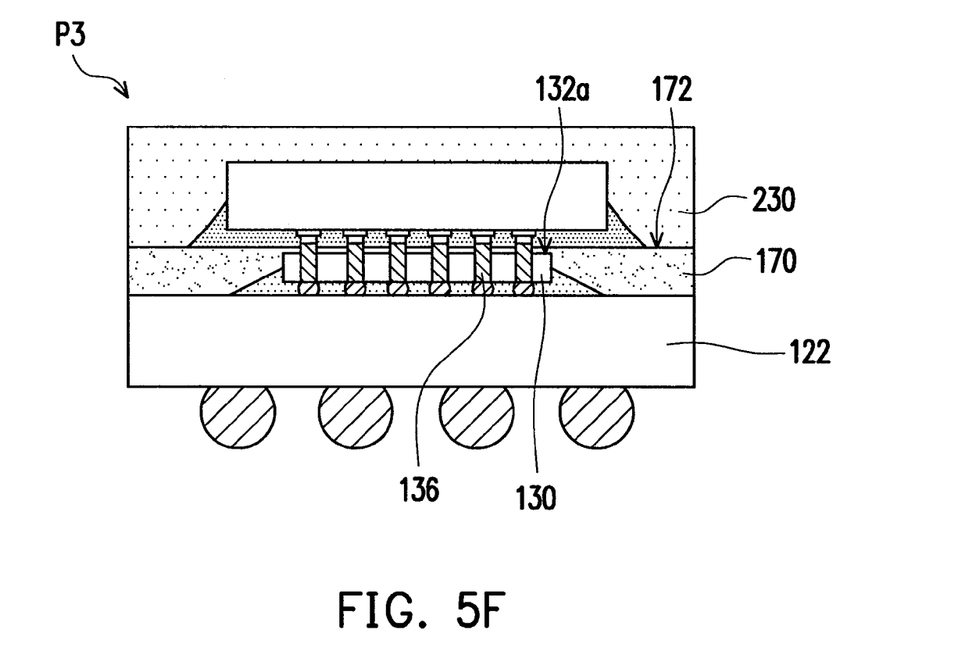

Next, referring FIG. 5F, the second protection layer 170, the third protection layer 230 and the circuit mother board 120 are sawed along an outline of each of the circuit boards 122 to form a plurality of package structures P3.

The package structure P3 is mostly similar to the package structure P in FIG. 3F except the second protection layer 170 covers the top surface 132a of each of the first semiconductor devices 130, and the conductive vias 136 protrude from the surface 172 of the second protection layer 170 far away from the circuit mother board 120. In the present embodiment, the surface 172 of the second protection layer 170 is higher than the top surface 132a of the first semiconductor device 130.

In summary, a package structure is provided by disposing the first semiconductor device on the circuit mother board to expose conductive vias of the first semiconductor device. Then, a preferred second semiconductor device can be optionally and selectively bonded to the first semiconductor device according to practical requirements. Therefore, the selectivity and collocation between the first semiconductor device and the second semiconductor device is flexible.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A package structure, comprising:
a circuit board;
a first semiconductor device disposed on the circuit board, wherein the first semiconductor device has an upper surface and a lower surface which is opposite to the upper surface and facing the circuit board, the first semiconductor device has a plurality of conductive vias, and each of the conductive vias has a first end surface protruding from the upper surface and a second end surface exposed by the lower surface wherein the second end surface is attached to the circuit board by a conductive bump;
a first protection layer disposed on the circuit board, wherein the first protection layer covers portions of the upper surface and a side wall of the first semiconductor device and exposes the first end surface of each of the conductive vias;
a second semiconductor device disposed on the upper surface of the first semiconductor device and connected to the conductive vias of the first semiconductor device; and
a second protection layer disposed on at least a portion of an upper surface of the first protection layer and encapsulating the second semiconductor device, wherein a side wall of the second protection layer is substantially aligned with a side wall of the first protection layer and a side wall of the circuit board.

2. The package structure as claimed in claim 1, further comprising:
a covering layer disposed on the first end surface of each of the conductive vias.

3. The package structure as claimed in claim 1, further comprising: a first underfill material disposed between the first semiconductor device and the circuit board.

4. The package structure as claimed in claim 3, wherein the first underfill material is interlaced between the conductive bumps.

5. The package structure as claimed in claim 1, further comprising: a second underfill material disposed between the first semiconductor device and the second semiconductor device, the second underfill material surrounding the first end surface of each of the conductive vias.

6. The package structure as claimed in claim 1, wherein an upper surface of the first protection layer is substantially coplanar with the upper surface of the first semiconductor device.

7. A semiconductor structure, comprising:
a circuit board;
a first semiconductor device disposed on the circuit board, the first semiconductor device including a conductive via wherein a first end of the conductive via protrudes from the semiconductor device and a second end of the conductive via is in electrical contact with the circuit board;
an insulating paste disposed between the circuit board and the first semiconductor device;
a first protection layer covering lateral surfaces of the first semiconductor device;
a second semiconductor device attached to the protruding first end of the conductive via; and
a second protection layer comprising a single material disposed on at least a portion of an upper surface of the first protection layer and encapsulating the second semiconductor device and portions of the protruding first end of the conductive via, wherein a side wall of the second protection layer is substantially aligned with a side wall of the first protection layer and a side wall of the circuit board.

8. A semiconductor structure, comprising:
a substrate;
a first semiconductor device disposed on the substrate, the first semiconductor device including a plurality of conductive vias, each of the conductive vias having:
a first end protruding from the first semiconductor device; and
a second end attached to the substrate;
a second semiconductor device coupled to the protruding first end of each of the conductive vias;
an insulating paste disposed between the first semiconductor device and the second semiconductor device;
a first protection layer encapsulating a portion of the first semiconductor device; and
a second protection layer disposed on at least a portion of an upper surface of the first protection layer and covering the second semiconductor device, wherein a side wall of the second protection layer is substantially aligned with a side wall of the first protection layer and a side wall of the substrate;

wherein an upper surface of the first protection layer is substantially coplanar with an upper surface of the first semiconductor device.

9. The semiconductor structure of claim 8, wherein a covering layer is disposed on the protruding first end of each of the conductive vias.

10. The semiconductor structure of claim 9, wherein the covering layer prevents the protruding first end of the conductive via from oxidation.

11. The semiconductor structure of claim 8, further comprising an insulating paste disposed between the first semiconductor device and the substrate.

12. A package structure, comprising:
a circuit board;
a first semiconductor device disposed on the circuit board, wherein the first semiconductor device has an upper surface and a lower surface which is opposite to the upper surface and facing the circuit board, the first semiconductor device has a plurality of conductive vias, and each of the conductive vias has a first end surface protruding from the upper surface and a second end surface exposed by the lower surface wherein the second end surface is attached to the circuit board by a conductive bump;
a first protection layer disposed on the circuit board, wherein the first protection layer covers at least a side wall of the first semiconductor device and exposes the first end surface of each of the conductive vias;
a second semiconductor device disposed on the upper surface of the first semiconductor device and connected to the conductive vias of the first semiconductor device; and
a second protection layer disposed on at least a portion of an upper surface of the first protection layer and encapsulating the second semiconductor device and a portion of the first end surface of each of the conductive vias, wherein a side wall of the second protection layer is substantially aligned with a side wall of the first protection layer and a side wall of the circuit board.

13. A semiconductor structure, comprising:
a circuit board;
a first semiconductor device disposed on the circuit board, the first semiconductor device including a conductive via wherein a first end of the conductive via protrudes from the semiconductor device and a second end of the conductive via is in electrical contact with the circuit board;
an insulating paste disposed between the circuit board and the first semiconductor device;
a first protection layer covering lateral surfaces of the first semiconductor device;
a second semiconductor device attached to the protruding first end of the conductive via;
a second protection layer disposed on at least a portion of an upper surface of the first protection layer and encapsulating the second semiconductor device, wherein a side wall of the second protection layer is substantially aligned with a side wall of the first protection layer and a side wall of the circuit board; and a second insulating paste disposed between the first semiconductor device and the second semiconductor device so as to surround a side wall of the protruding first end of the conductive via.

14. A semiconductor structure, comprising:
a circuit board;
a first semiconductor device disposed on the circuit board, the first semiconductor device including a conductive via wherein a first end of the conductive via protrudes from the semiconductor device and a second end of the conductive via is in electrical contact with the circuit board;
an insulating paste disposed between the circuit board and the first semiconductor device;
a first protection layer covering lateral surfaces of the first semiconductor device;
a second semiconductor device attached to the protruding first end of the conductive via; and
a second protection layer disposed on at least a portion of an upper surface of the first protection layer and encapsulating the second semiconductor device, wherein a side wall of the second protection layer is substantially aligned with a side wall of the first protection layer and a side wall of the circuit board;
wherein an upper surface of the first protection layer is substantially coplanar with an upper surface of the first semiconductor device.

15. The package structure as claimed in claim 7, further comprising:
a first underfill material disposed between the first semiconductor device and the circuit board.

16. The package structure as claimed in claim 7, further comprising: a second underfill material disposed between the first semiconductor device and the second semiconductor device, the second underfill material surrounding the first end surface of the conductive via.

17. The package structure as claimed in claim 7, wherein an upper surface of the first protection layer is substantially coplanar with an upper surface of the first semiconductor device.

18. The package structure as claimed in claim 12, further comprising:
a covering layer disposed on the first end surface of each of the conductive vias.

19. The package structure as claimed in claim 12, wherein an upper surface of the first protection layer is substantially coplanar with the upper surface of the first semiconductor device.

20. The package structure as claimed in claim 13, further comprising:
a first underfill material disposed between the first semiconductor device and the circuit board.

21. The package structure as claimed in claim 13, wherein an upper surface of the first protection layer is substantially coplanar with an upper surface of the first semiconductor device.

22. The package structure as claimed in claim 14, further comprising:
a first underfill material disposed between the first semiconductor device and the circuit board.

23. The package structure as claimed in claim 14, further comprising: a second underfill material disposed between the first semiconductor device and the second semiconductor device, the second underfill material surrounding the first end surface of the conductive via.

* * * * *